US012625512B2

(12) United States Patent
Sato

(10) Patent No.: US 12,625,512 B2
(45) Date of Patent: May 12, 2026

(54) SINE WAVE GENERATION CIRCUIT AND TEST DEVICE

(71) Applicant: ROHM CO., LTD., Kyoto (JP)

(72) Inventor: Keno Sato, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 2 days.

(21) Appl. No.: 18/766,786

(22) Filed: Jul. 9, 2024

(65) Prior Publication Data

US 2025/0021128 A1 Jan. 16, 2025

(30) Foreign Application Priority Data

Jul. 12, 2023 (JP) ................................. 2023-114748

(51) Int. Cl.
| | |
|---|---|
| *G06F 1/02* | (2006.01) |
| *G06F 17/14* | (2006.01) |
| *H03M 1/12* | (2006.01) |

(52) U.S. Cl.
CPC ............ *G06F 1/022* (2013.01); *G06F 17/141* (2013.01); *H03M 1/1255* (2013.01)

(58) Field of Classification Search
CPC .... G06F 1/022; G06F 17/141; H03M 1/1255; H03B 28/00; H03K 3/80
See application file for complete search history.

(56) References Cited

U.S. PATENT DOCUMENTS

| | | | | |
|---|---|---|---|---|
| 2004/0198266 A1* | 10/2004 | Lamacraft | ............. | H04W 52/04 |
| | | | | 455/125 |
| 2006/0020865 A1* | 1/2006 | Dai | .................. | G01R 31/31813 |
| | | | | 714/738 |
| 2016/0131600 A1* | 5/2016 | Pate | ....................... | G01N 22/00 |
| | | | | 250/339.08 |

FOREIGN PATENT DOCUMENTS

| | | |
|---|---|---|
| JP | 2018166325 A | 10/2018 |
| JP | 2021044690 A | 3/2021 |

* cited by examiner

*Primary Examiner* — Metasebia T Retebo
(74) *Attorney, Agent, or Firm* — CANTOR COLBURN LLP

(57) ABSTRACT

A sine wave generation circuit includes: a first direct digital synthesizer generating a digital sine wave fundamental signal having a frequency $f_0$ in a normal operation mode and a calibration mode; a second direct digital synthesizer generating a digital second harmonic correction signal having a frequency $2f_0$ in the normal operation mode; a correction circuit superimposing the digital second harmonic correction signal on the digital sine wave fundamental signal; a D/A converter converting an output of the correction circuit into an analog sine wave signal; an output buffer receiving the analog sine wave signal and outputting an analog sine wave output signal; an A/D converter converting the analog sine wave output signal into a digital signal in the calibration mode; and a processing circuit generating a spectrum based on the digital signal in the calibration mode and setting a parameter of the second direct digital synthesizer based on the spectrum.

4 Claims, 15 Drawing Sheets

Before calibration

FIG. 6B

After calibration

Before calibration

After calibration

FIG. 8A

Before calibration

After calibration

Before calibration

After calibration

FIG. 11

SINE WAVE GENERATION CIRCUIT AND TEST DEVICE

CROSS-REFERENCE TO RELATED APPLICATION

The present invention claims priority under 35 U.S.C. § 119 to Japanese Patent Application No. 2023-114748, filed on Jul. 12, 2023, the entire contents of which are incorporated herein by reference.

TECHNICAL FIELD

The present disclosure relates to a sine wave generation circuit.

BACKGROUND

Analog sine wave signals (trigonometric functions) are used in various applications such as semiconductor test devices and wireless communication circuits. As a method of generating an analog sine wave signal, a method is known in which a digital sine wave signal is generated by a direct digital synthesizer (DDS) and is converted into an analog sine wave signal by a D/A converter.

BRIEF DESCRIPTION OF DRAWINGS

The accompanying drawings, which are incorporated in and constitute a part of the specification, illustrate embodiments of the present disclosure.

FIG. 6A and FIG. 6B are diagrams showing measurement results of the sine wave generation circuit of FIG. 4.

FIG. 8A and FIG. 8B are diagrams showing measurement results of the sine wave generation circuit of FIG. 4 by an external measuring device.

FIG. 11 is a block diagram of a test device according to an embodiment.

DETAILED DESCRIPTION

Figure 1:
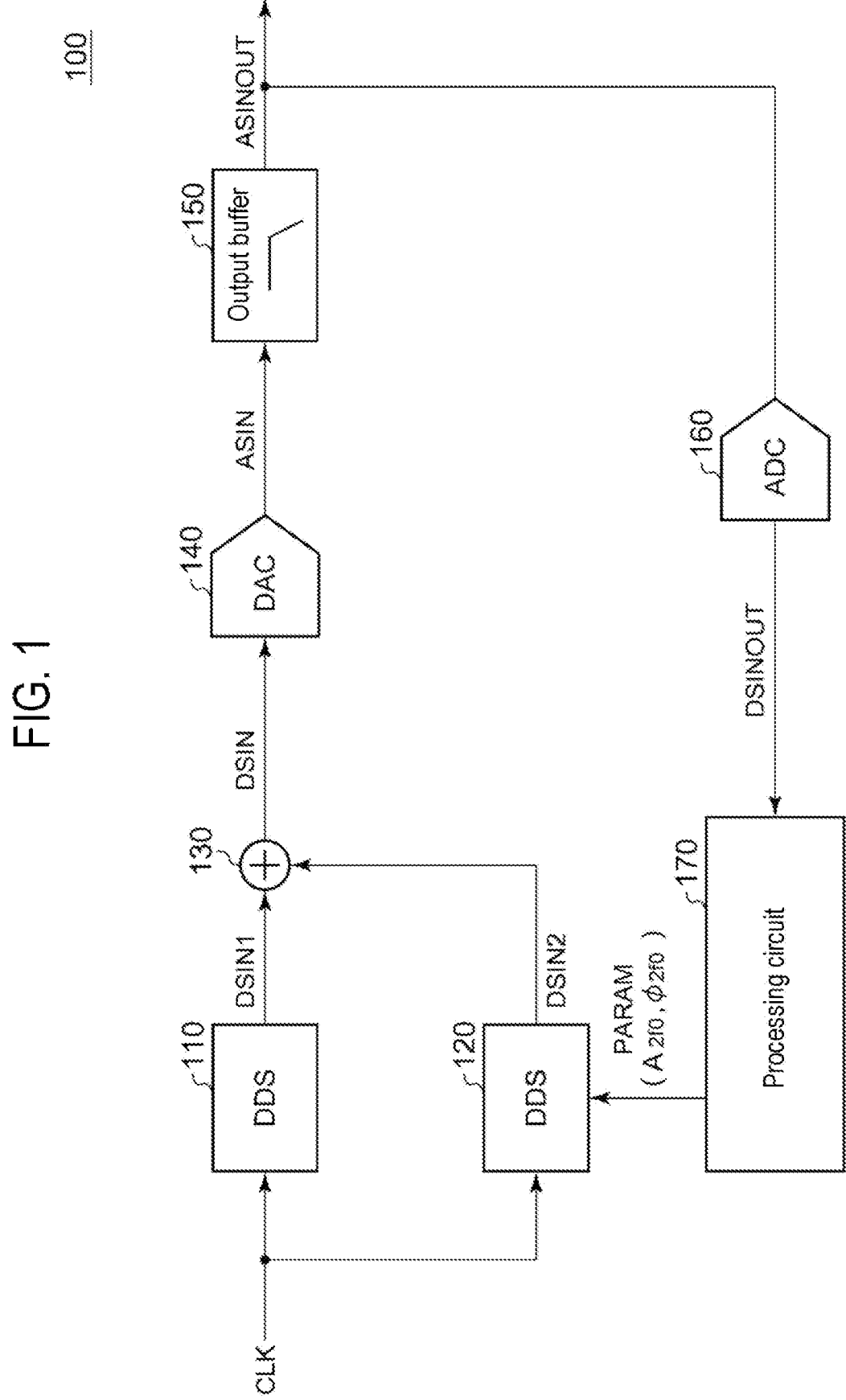
FIG. 1 is a block diagram of a sine wave generation circuit according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

OVERVIEW OF EMBODIMENTS

The overview of some exemplary embodiments of the present disclosure is described. This overview presents, in a simplified form, some concepts of one or more embodiments, as a prologue to the detailed description which is presented later, and for the purpose of basic understanding of the embodiments, but it is not intended to limit the scope of the disclosure. This overview is not a comprehensive overview of all possible embodiments, and it is intended to neither identify key elements of all embodiments nor delineate the scope of some or all aspects. For the sake of convenience, "an embodiment" may be used to refer to one embodiment (example or modification) or a plurality of embodiments (examples or modifications) disclosed herein.

A sine wave generation circuit according to an embodiment includes: a first direct digital synthesizer configured to generate a digital sine wave fundamental signal having a frequency $f_0$ in a normal operation mode and a calibration mode; a second direct digital synthesizer configured to generate a digital second harmonic correction signal having a frequency $2f_0$ in the normal operation mode; a correction circuit configured to superimpose the digital second harmonic correction signal on the digital sine wave fundamental signal; a D/A converter configured to convert an output of the correction circuit into an analog sine wave signal; an output buffer configured to receive the analog sine wave signal and output an analog sine wave output signal; an A/D converter configured to convert the analog sine wave output signal into a digital signal in the calibration mode; and a processing circuit configured to generate a spectrum by performing Fast Fourier Transform on the digital signal output by the A/D converter in the calibration mode and set a parameter of the second direct digital synthesizer based on information on the frequency $2f_0$ in the spectrum.

In the calibration mode, the processing circuit detects a second harmonic generated due to distortion of the output buffer and determines a phase and an amplitude of the digital second harmonic correction signal to cancel the second harmonic. Then, in the normal operation mode, by digital signal processing, the digital second harmonic correction signal whose phase and amplitude have been optimized is superimposed onto the digital sine wave fundamental signal, thereby cancelling the second harmonic generated in the output buffer and reducing distortion of the analog sine wave output signal obtained in the end.

In one embodiment, the processing circuit may perform Fast Fourier Transform on waveform data whose starting point is a peak of a waveform of the digital signal generated by the A/D converter.

In one embodiment, the sine wave generation circuit may further include a third direct digital synthesizer configured to generate a digital third harmonic correction signal having a frequency $3f_0$ in the normal operation mode. The correction circuit may superimpose the digital second harmonic correction signal and the digital third harmonic correction signal on the digital sine wave fundamental signal. The processing circuit may set a parameter of the third direct digital synthesizer based on information on the frequency $3f_0$ in the spectrum.

In one embodiment, the first direct digital synthesizer and the second direct digital synthesizer may include the same configuration and operate based on a common clock signal. This allows for more accurate correction.

In one embodiment, the first direct digital synthesizer may include a first integrator configured to integrate a first input value according to the clock signal, and a first waveform generator that configured to include a sine wave table and output a value of a sine wave according to an output of the first integrator by referring to the sine wave table. The second direct digital synthesizer may include a second integrator configured to integrate a second input value according to the clock signal, and a second waveform generator configured to include a sine wave table and output a value of a sine wave according to an output of the second integrator. The second input value may be twice the first input value.

A test device converter according to another embodiment includes a sine wave generation circuit configured to generate a sine wave signal to be supplied to a device under test that includes an A/D converter, and an analyzer configured to analyze a digital signal output by the A/D converter in response to the sine wave signal.

Embodiments

Preferred embodiments will now be described with reference to the drawings. Like or equivalent components, members, and processes illustrated in each drawing are given like reference numerals and a repeated description thereof will be appropriately omitted. Further, the embodiments are presented by way of example only and are not intended to limit the present disclosure, and any features or combination thereof described in the embodiments may not necessarily be essential to the present disclosure.

In the present disclosure, "a state where a member A is connected to a member B" includes a case where the member A and the member B are directly connected physically or even a case where the member A and the member B are indirectly connected through any other member that does not affect an electrical connection state between the members A and B or does not impair functions and effects achieved by combinations of the members A and B.

Similarly, "a state where a member C is provided between a member A and a member B" includes a case where the member A and the member C or the member B and the member C are indirectly connected through any other member that does not affect an electrical connection state between the members A and C or the members B and C or does not impair functions and effects achieved by combinations of the members A and C or the members B and C, in addition to a case where the member A and the member C or the member B and the member C are directly connected.

In addition, vertical and horizontal axes of a waveform diagram and a time chart shown in the present disclosure are enlarged or reduced as appropriate for ease of understanding, and each waveform shown is also simplified for ease of understanding.

FIG. 1 is a block diagram of a sine wave generation circuit 100 according to an embodiment. The sine wave generation circuit 100 generates an analog sine wave output signal ASINOUT having a frequency $f_0$.

The sine wave generation circuit 100 includes a first direct digital synthesizer 110, a second direct digital synthesizer 120, a correction circuit 130, a D/A converter 140, an output buffer 150, an A/D converter 160, and a processing circuit 170.

The sine wave generation circuit 100 is capable of being switched between a normal operation mode and a calibration mode. The sine wave generation circuit 100 operates in the calibration mode prior to the normal operation mode. For example, the sine wave generation circuit 100 may operate in the calibration mode each time the frequency $f_0$ of the analog sine wave output signal ASINOUT is changed. Alternatively, the sine wave generation circuit 100 may operate in the calibration mode at predetermined time intervals, or may operate in the calibration mode using a temperature change or the like as a trigger.

The first direct digital synthesizer 110 generates a digital sine wave fundamental signal DSIN1 having a frequency $f_0$ in the normal operation mode and the calibration operation mode.

The second direct digital synthesizer 120 generates a digital second harmonic correction signal DSIN2 having a frequency $2f_0$ in the normal operation mode.

The correction circuit 130 superimposes the digital second harmonic correction signal DSIN2 on the digital sine wave fundamental signal DSIN1. In the normal operation mode, an output signal DSIN of the correction circuit 130 is a composite signal (sum signal or difference signal) of the digital sine wave fundamental signal DSIN1 and the digital second harmonic correction signal DSIN2. In the calibration mode, since the digital second harmonic correction signal DSIN2 is not generated, the output signal DSIN of the correction circuit 130 is the digital sine wave fundamental signal DSIN1.

The D/A converter 140 converts the output signal DSIN of the correction circuit 130 into an analog sine wave signal ASIN.

The output buffer 150 has filter characteristics, receives the analog sine wave signal ASIN, and outputs the analog sine wave output signal ASINOUT. In the output buffer 150, the output signal ASIN of the D/A converter 140 is amplified and unnecessary frequency components are removed. The gain of the output buffer 150 may be 1, greater than 1, or less than 1. The output buffer 150 may be a low-pass filter or a band-pass filter.

The A/D converter 160 converts the analog sine wave output signal ASINOUT into a digital signal DSINOUT in the calibration mode.

The processing circuit 170 performs Fast Fourier Transform (FFT) on the digital signal DSINOUT output from the A/D converter 160 to generate a complex spectrum, in the calibration mode. Then, a parameter PARAM of the second direct digital synthesizer 120 is set based on information on frequency $2f_0$ in the complex spectrum. Specifically, the parameter PARAM may include amplitude information $A_{2f0}$ and phase information $\varphi_{2f0}$. The second direct digital synthesizer 120 generates the digital second harmonic correction signal DSIN2 based on the amplitude information $A_{2f0}$ and the phase information $\varphi_{2f0}$ in the normal operation mode.

In FFT, a shift (delay) T of a waveform on a time axis in a time domain appears as a phase shift $-T\omega$ in a frequency domain. It is preferable that the processing circuit 170 performs Fast Fourier Transform on waveform data whose starting point is a peak of a waveform of the digital signal generated by the A/D converter 160. As a result, since the waveform is always cut out at the same position, variations in the phase information $-T\omega$ caused by the delay T may be eliminated.

The above is a configuration of the sine wave generation circuit 100. Subsequently, its operation is described.

Figure 2:
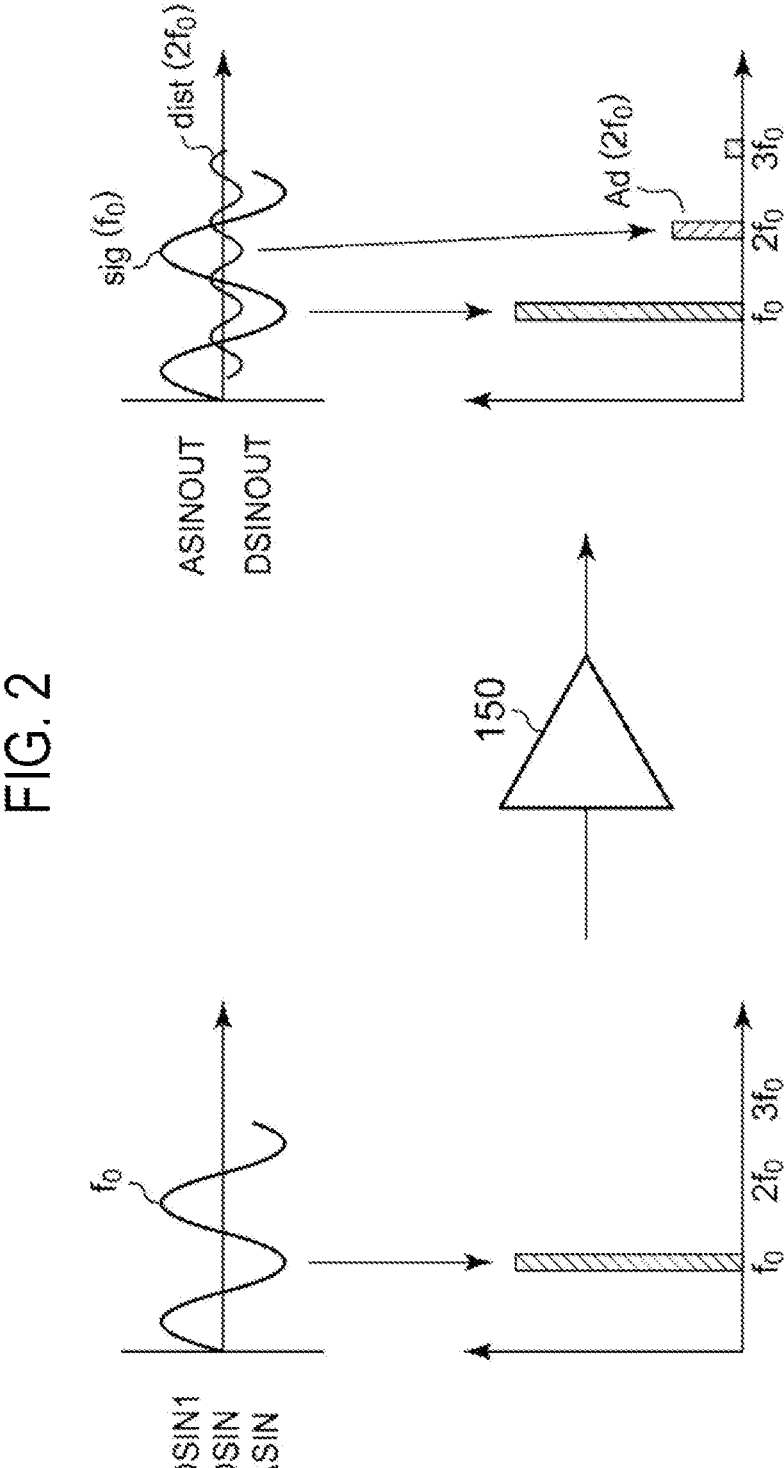
FIG. 2 is a diagram illustrating an operation of the sine wave generation circuit of FIG. 1 in a calibration mode.

FIG. 2 is a diagram illustrating an operation of the sine wave generation circuit 100 of FIG. 1 in the calibration mode. A time waveform and an amplitude spectrum of an analog or digital sine signal before the output buffer 150 are shown on the left side of FIG. 2.

For ease of understanding and simplification of explanation, it is assumed that the digital sine wave fundamental signal DSIN1 generated by the first direct digital synthesizer 110 is an ideal sine wave, and waveform distortions in the correction circuit 130 and the D/A converter 140 are negligible. In the calibration mode, since the digital second harmonic correction signal DSIN2 is 0, the output signal DSIN of the correction circuit 130 is the same as the digital sine wave fundamental signal DSIN1 and is an ideal sine wave. The analog sine wave signal ASIN, which is the output of the D/A converter 140, is also an ideal sine wave. The amplitude spectra of the sine wave signals DSIN1, DSIN, and ASIN include only the component of the fundamental wave $f_0$, and the harmonic components $2f_0$, $3f_0$, . . . may be ignored.

The right side of FIG. 2 shows a time waveform and an amplitude spectrum of analog or digital sine wave signals ASINOUT and DSINOUT behind the output buffer 150. Since waveform distortion is introduced by the amplification of the analog sine wave signal ASIN by the output buffer 150, the analog sine wave output signal ASINOUT after the amplification includes distortion components dist ($2f_0$, $3f_0$, . . . ) of high-order harmonics in addition to a signal component sig ($f_0$) of the fundamental wave.

A complex spectrum of the output ASINOUT (DSINOUT) of the output buffer 150 is generated by FFT by the processing circuit 170, and an amplitude $Ad_{2f0}$ and a phase $\varphi d_{2f0}$ of the distortion component dist ($2f_0$) of the second harmonic $2f_0$ are detected. The processing circuit 170 determines the parameters PARAM of the second direct digital synthesizer 120, that is, the amplitude $A_{2f0}$ and the phase $\varphi_{2f0}$ of the digital second harmonic correction signal DSIN2, so that the second harmonic $2f_0$ included in the output ASINOUT of the output buffer 150 is canceled.

The above is an operation of the calibration mode.

Figure 3:
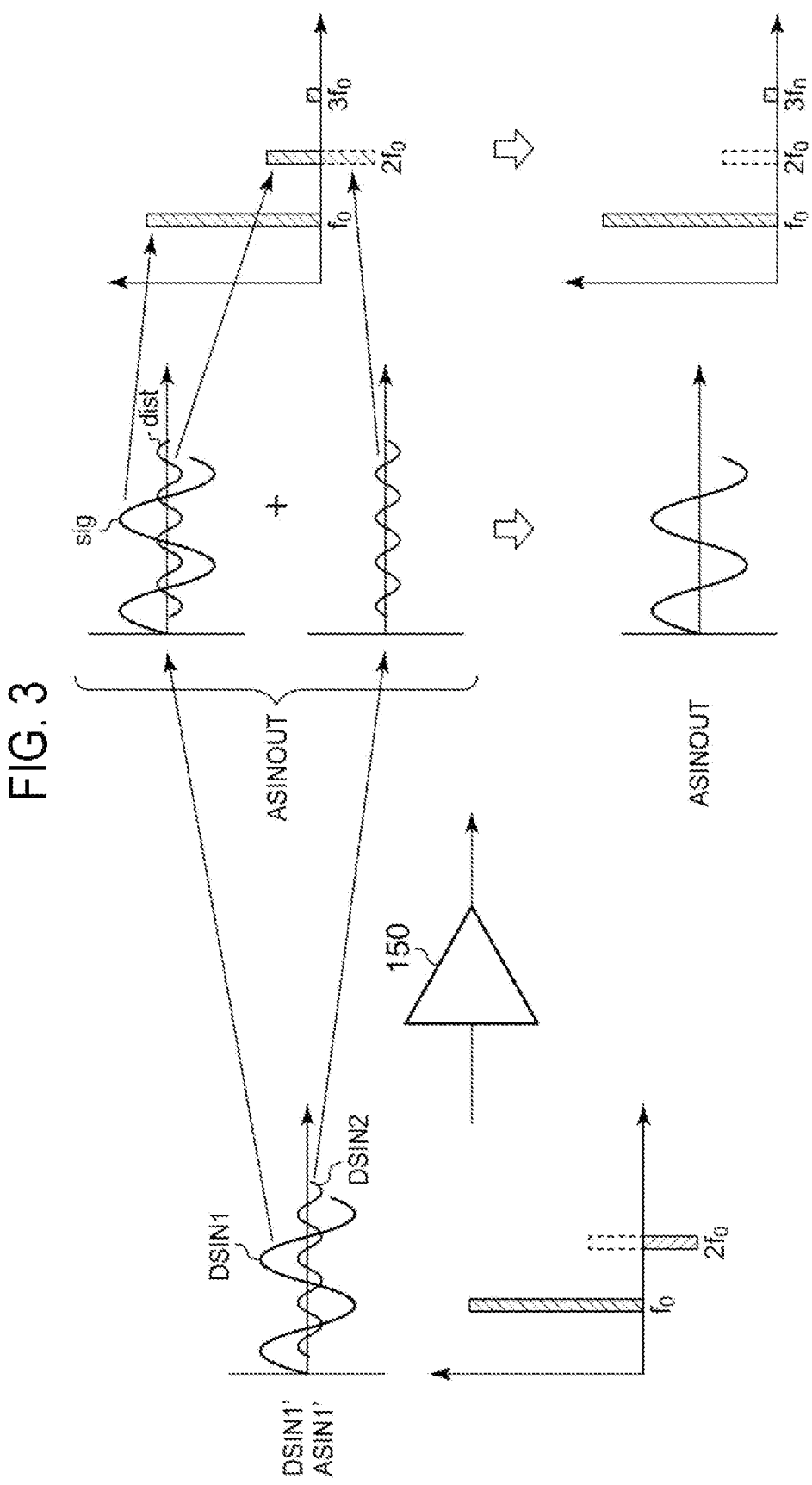
FIG. 3 is a diagram illustrating an operation of the sine wave generation circuit of FIG. 1 in a normal operation mode.

FIG. 3 is a diagram illustrating an operation of the sine wave generation circuit 100 of FIG. 1 in the normal operation mode. The left side of FIG. 3 shows waveforms and amplitude spectra of the digital sine wave fundamental signal DSIN1 and the digital second harmonic correction signal DSIN2. The digital sine wave fundamental signal DSIN is a sum of the digital sine wave fundamental signal DSIN1 and the digital second harmonic correction signal DSIN2. The digital second harmonic correction signal DSIN2 has an amplitude $A_{2f0}$ that corresponds to the second harmonic distortion component dist ($2f_0$) included in the sine wave output signal ASINOUT (DSINOUT) measured in the calibration mode. Further, the digital second harmonic correction signal DSIN2 has a phase $\varphi_{2f0}$ that is opposite to the phase of the second harmonic distortion component dist ($2f_0$) included in the sine wave output signal ASINOUT (DSINOUT) measured in the calibration mode.

The digital sine wave fundamental signal DSIN is amplified by the output buffer 150. The amplified analog sine wave output signal ASINOUT may be decomposed into a component corresponding to the digital sine wave fundamental signal DSIN1 and a component corresponding to the digital second harmonic correction signal DSIN2. The component corresponding to the digital sine wave fundamental signal DSIN1 includes a signal component sig and a distortion component dist. This distortion component dist and the component caused by the digital second harmonic correction signal DSIN2 cancel out each other. Therefore, the analog sine wave output signal ASINOUT generated by the sine wave generation circuit 100 in the normal mode is a low distortion signal including almost no second harmonic component.

Figure 4:
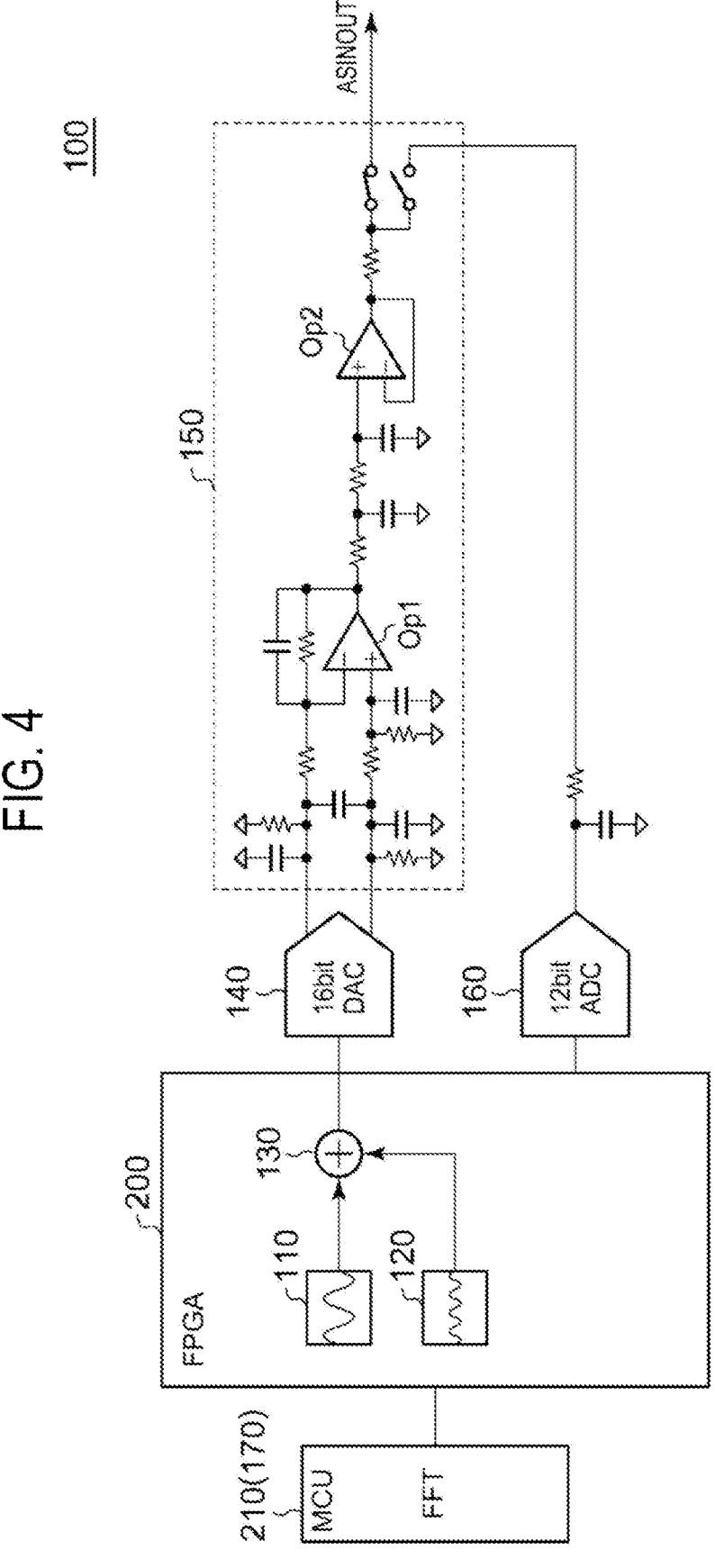
FIG. 4 is a block diagram of a sine wave generation circuit according to one Example.

FIG. 4 is a block diagram of the sine wave generation circuit 100 according to one Example. The first direct digital synthesizer 110, the second direct digital synthesizer 120, and the correction circuit 130 may be implemented as an FPGA (Field Programmable Gate Array) 200. The processing circuit 170 is implemented as a microcontroller (MCU) 210.

The FPGA 200 also has a function of an interface between the A/D converter 160 and the processing circuit 170. That is, the FPGA 200 delivers the digital sine wave output signal DSINOUT generated by the A/D converter 160 to the MCU 210 which is the processing circuit 170.

In one Example, the D/A converter 140 uses a 16-bit, 50 Msps differential current output DAC (LT1668) manufactured by Analog Devices company. The A/D converter 160 uses a 12-bit, 1 Msps ADC (BU79100) manufactured by Rohm company.

The output buffer 150 includes operational amplifiers Op1 and Op2, resistors, and capacitors. The preceding operational amplifier Op1 forms a low-pass filter together with a resistor and a capacitor. The topology and order of the low-pass filter are not particularly limited. The subsequent operational amplifier Op2 is a voltage follower and functions as a buffer.

Figure 5:
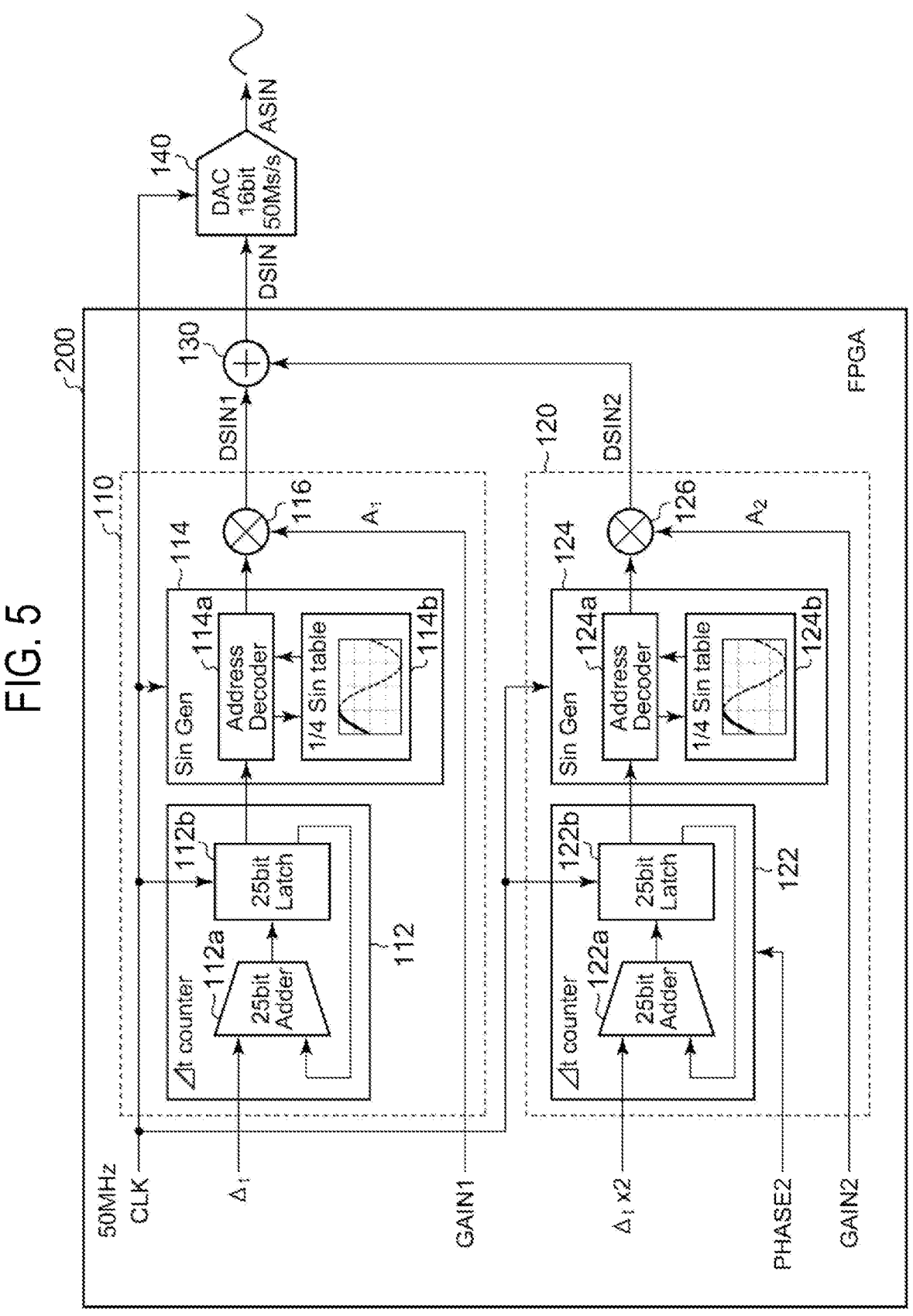
FIG. 5 is a block diagram of a first direct digital synthesizer and a second direct digital synthesizer in FIG. 4.

FIG. 5 is a block diagram of the first direct digital synthesizer 110 and the second direct digital synthesizer 120 of FIG. 4. The first direct digital synthesizer 110 and the second direct digital synthesizer 120 have substantially the same configuration and are configured to operate based on a common clock signal CLK.

The first direct digital synthesizer 110 includes a first integrator 112, a first waveform generator 114, and a multiplier 116. The first integrator 112 integrates a value $\Delta t$ that defines the frequency of the digital sine wave fundamental signal DSIN1 in synchronization with the clock signal CLK. The frequency of the clock signal CLK is, for example, 50 MHz. The first integrator 112 includes an adder 112a and a latch 112b. Each time the clock signal CLK is input, the adder 112a adds $\Delta t$ to a value stored in the latch 112b and stores the added value in the latch 112b. An output value of the first integrator 112 is phase information of the digital sine wave fundamental signal DSIN1 and corresponds to ($2\pi f_0 t + \varphi_1$) when the digital sine wave fundamental signal DSIN1 is $A_1 \cdot \sin(2\pi f_0 t + \varphi_1)$. $\varphi_1$ is an initial phase corresponding to an initial value of the latch 112b and may be set to, for example, 0.

The first waveform generator 114 includes an address decoder 114a and a waveform table 114b. The waveform table 114b stores data for a ¼ period of the sine wave. The address decoder 114a outputs a sine wave value $\sin(2\pi f_0 t + \varphi_1)$ corresponding to the phase information ($2\pi f_0 t + \varphi_1$) by referring to the waveform table 114b.

The multiplier 116 multiplies the output $\sin(2\pi f_0 t + \varphi_1)$ of the first waveform generator 114 by an amplitude $A_1$ based on a gain parameter GAIN1.

The second direct digital synthesizer 120 is configured similarly to the first direct digital synthesizer 110 and includes a second integrator 122, a second waveform generator 124, and a second multiplier 126. An input value $\Delta t \times 2$ of the second integrator 122 is twice the input value $\Delta t$ of the first integrator 112.

An output value of the second integrator 122 is the phase information of the digital second harmonic correction signal DSIN2 and corresponds to $(4\pi f_0 t+\varphi_2)$ when the digital second harmonic correction signal DSIN2 is $A_2 \cdot \sin(2\pi \cdot 2f_0 t+\varphi_2)$. $\varphi_2$ is an initial phase corresponding to an initial value of a latch 122b and is set based on a phase parameter PHASE2.

The second waveform generator 124 outputs a sine wave value $\sin(4\pi f_0 t+\varphi_2)$ corresponding to the phase information $(4\pi f_0 t+\varphi_2)$. According to this configuration, it is guaranteed that the frequency of the digital second harmonic correction signal DSIN2 is exactly twice the frequency of the digital sine wave fundamental signal DSIN1.

The second multiplier 126 multiplies the output $\sin(4\pi f_0 t+\varphi_2)$ of the second waveform generator 124 by an amplitude $A_2$ based on a gain parameter GAIN2.

The gain parameter GAIN2 and phase parameter PHASE2 of the second direct digital synthesizer 120 are parameter information PARAM set by the processing circuit 170. Specifically, the gain parameter GAIN2 is set based on the amplitude information $A_{2f0}$, and the phase parameter PHASE2 is set based on the phase information $\varphi_{2f0}$.

Figure 6A:
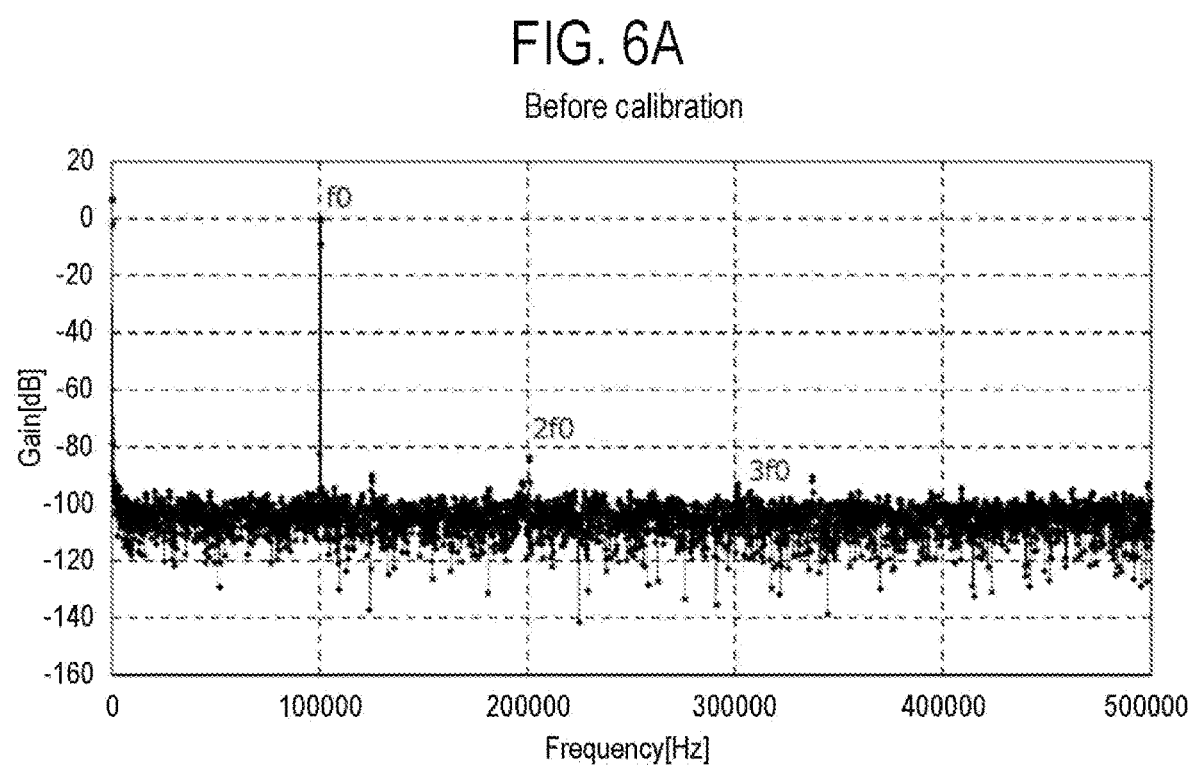
Figure 6B:
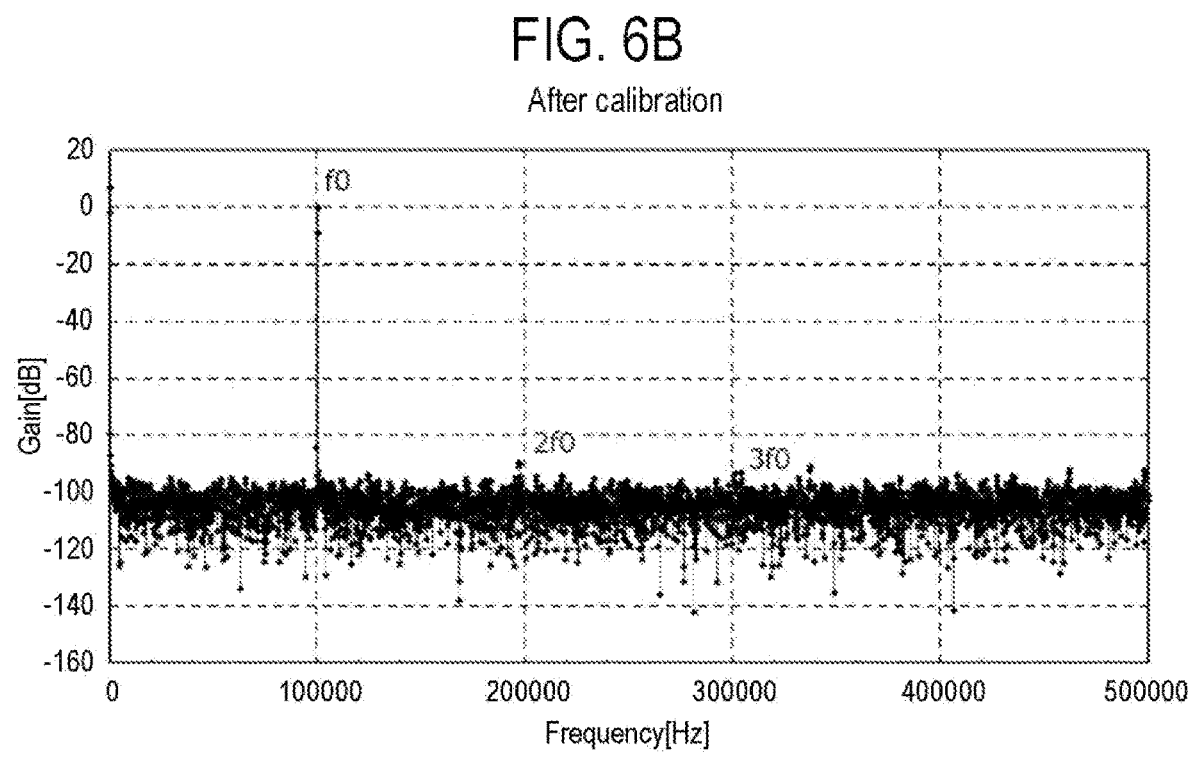

FIG. 6A and FIG. 6B are diagrams showing measurement results of the sine wave generation circuit 100 of FIG. 4. FIG. 6A shows an amplitude spectrum of the digital sine wave output signal DSINOUT measured by the A/D converter 160 before calibration, that is, in the calibration mode. Herein, the frequency $f_0$ of the fundamental wave is set to 100,341.7969 Hz.

Distortion components appear in the second harmonic $2f_0$, third harmonic $3f_0$, and fourth harmonic $4f_0$, and their relative strengths with respect to the fundamental wave $f_0$ are −85.43 dB, −95.47 dB, and −99.38 dB, respectively.

Characteristics of the digital sine wave output signal DSINOUT before calibration are evaluated as follows:
SNR (Signal to Noise Ratio) 71.76 dB
SINAD (Signal-to-Noise And Distortion Ratio) 71.55 dB
THD (Total Harmonic Distortion) −84.90 dB
SFDR (Spurious Free Dynamic Range) −85.43 dB
ENOB (Effective Number of Bits) 11.59 Bit
The gain parameter GAIN2 is determined based on the strength −85.43 dB of the distortion component of the second harmonic, and in this example, it is set to −85.43 dB. Further, the phase of the distortion component of the second harmonic is measured to be −57.63°. Therefore, 57.63°, which is an inversion of −57.63°, becomes the phase parameter PHASE2 of the second direct digital synthesizer 120.

FIG. 6B shows an amplitude spectrum of the digital sine wave output signal DSINOUT measured by the A/D converter 160 in the normal operation mode after calibration. The relative strengths of distortion components of the second harmonic $2f_0$, third harmonic $3f_0$, and fourth harmonic $4f_0$ with respect to the fundamental wave $f_0$ after calibration are −96.48 dB, −96.10 dB, and −98.27 dB, respectively.

Figure 7A:
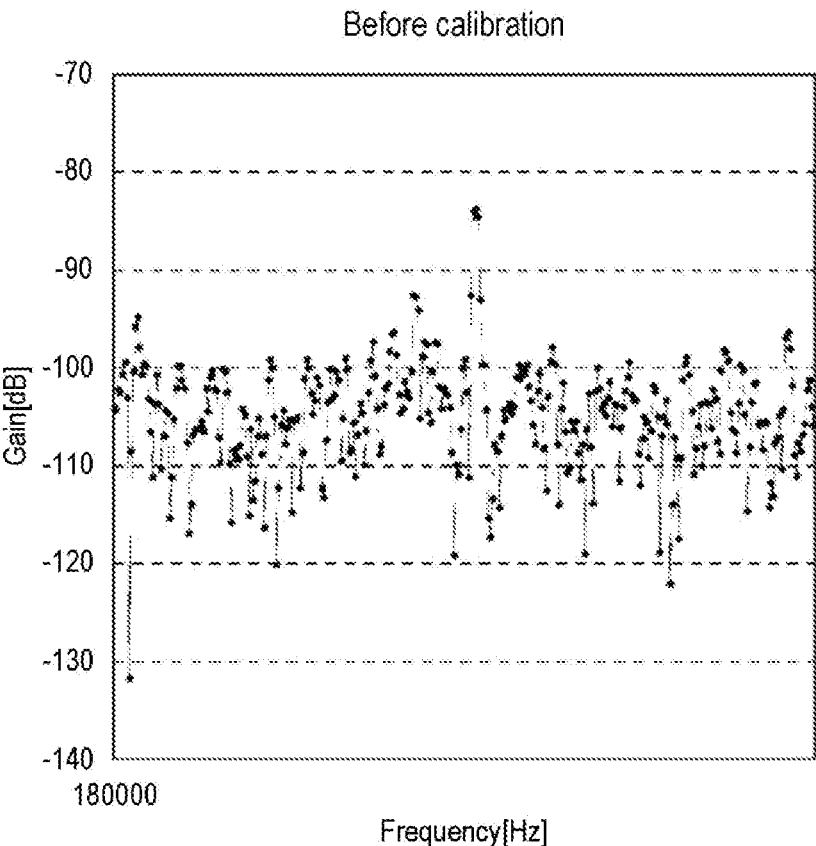
FIG. 7A and FIG. 7B are diagrams comparing second harmonics of spectra before and after calibration.
Figure 7B:
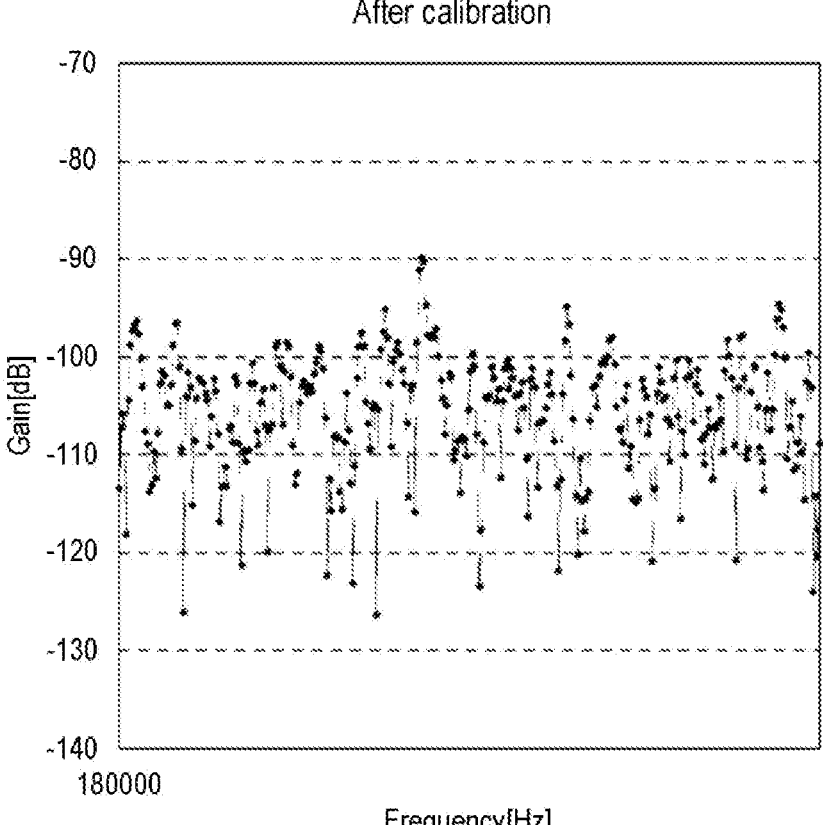

FIG. 7A and FIG. 7B are diagrams comparing second harmonics of the spectra before and after calibration. After calibration, the second harmonic is buried in a noise floor and is thus not detectable.

Characteristics of the digital sine wave output signal DSINOUT after calibration are evaluated as follows:
SNR (Signal to Noise Ratio) 72.01 dB
SINAD (Signal-to-Noise And Distortion Ratio) 71.96 dB
THD (Total Harmonic Distortion) −96.10 dB
SFDR (Spurious Free Dynamic Range) −89.68 dB
ENOB (Effective Number of Bits) 11.66 Bit
The evaluation results shown here are limited by the performance of the 12-bit, 1 Msps A/D converter 160. In order to evaluate the true ability of the sine wave generation circuit 100, the analog sine wave output signal ASINOUT generated by the sine wave generation circuit 100 is measured using an external measuring device. A 24-bit, 1 Msps digitizer (PXIe-4480) manufactured by National Instruments company is used as the external measuring device.

Figure 8A:
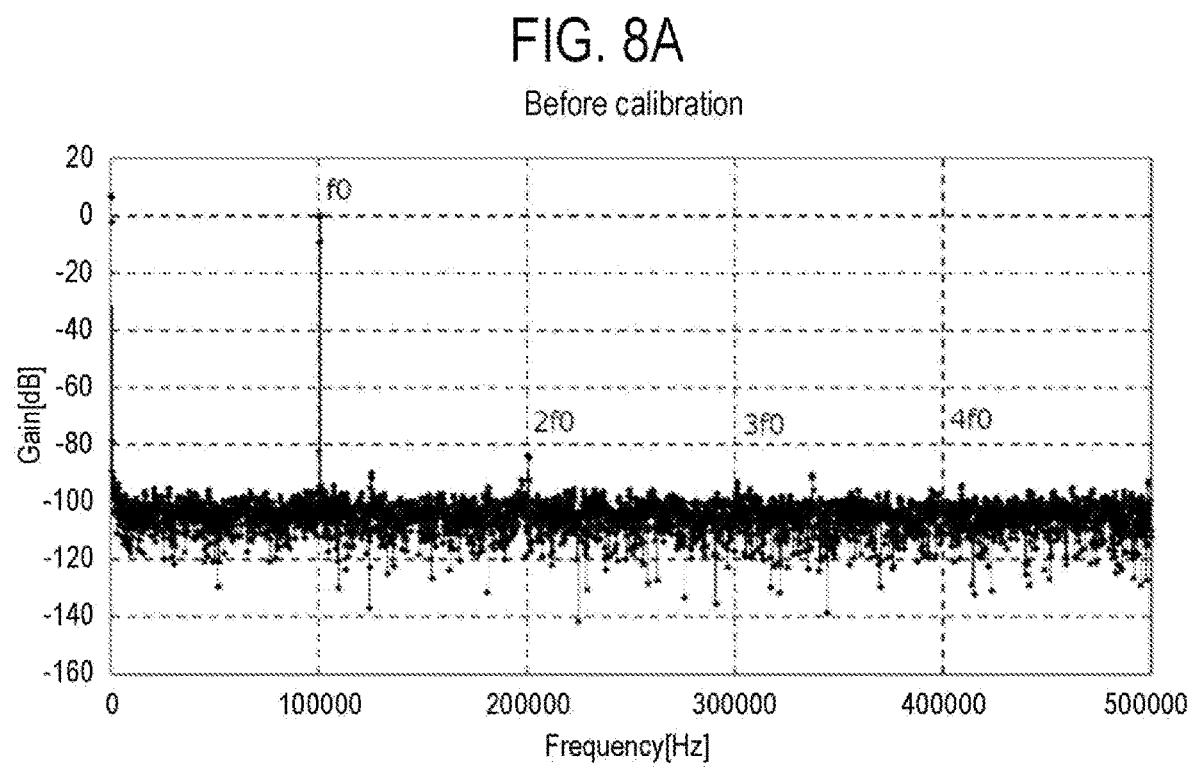
Figure 8B:
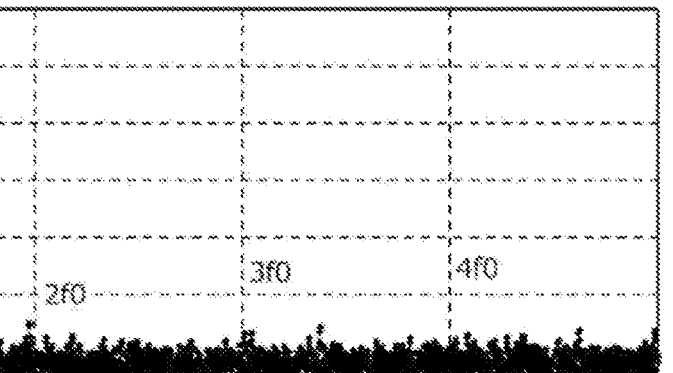

FIG. 8A and FIG. 8B are diagrams showing measurement results of the sine wave generation circuit 100 of FIG. 4 by the external measuring device. FIG. 8A shows an amplitude spectrum of the analog sine wave output signal ASINOUT measured by the external measuring device before calibration, that is, in the calibration mode.

The relative strengths of distortion components of the second harmonic $2f_0$, third harmonic $3f_0$, and fourth harmonic $4f_0$ with respect to the fundamental wave $f_0$ are −83.72 dB, −93.10 dB, and −103.93 dB, respectively.

Characteristics of the analog sine wave output signal ASINOUT before calibration are evaluated as follows:
SNR (Signal to Noise Ratio) 86.85 dB
SINAD (Signal-to-Noise And Distortion Ratio) 81.64 dB
THD (Total Harmonic Distortion) −83.21 dB
SFDR (Spurious Free Dynamic Range) −83.72 dB
The gain parameter GAIN2 is determined based on the strength −83.72 dB of the distortion component of the second harmonic, and in this example, it is set to −83.72 dB. Further, the phase of the distortion component of the second harmonic is measured to be −57.63°. Therefore, 57.63°, which is an inversion of −57.63°, becomes the phase parameter PHASE2 of the second direct digital synthesizer 120.

FIG. 8B shows an amplitude spectrum of the analog sine wave output signal ASINOUT measured by the external measuring device in the normal operation mode after calibration. The relative strengths of distortion components of the second harmonic $2f_0$, third harmonic $3f_0$, and fourth harmonic $4f_0$ with respect to the fundamental wave $f_0$ after calibration are −92.90 dB, −93.34 dB, and −104.36 dB, respectively.

Figure 9A:
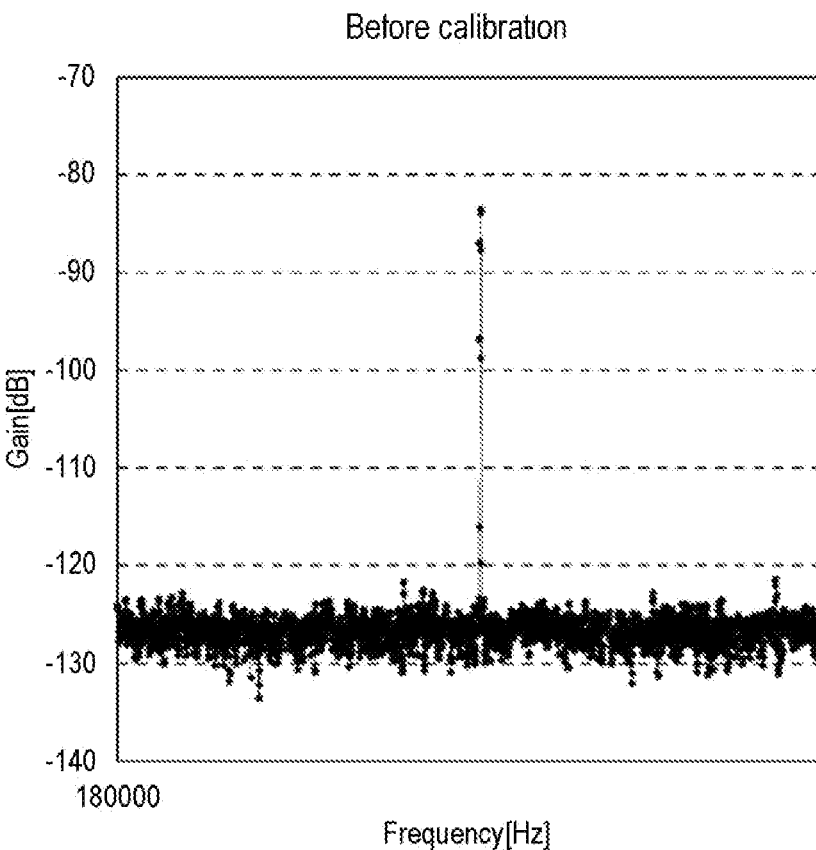
FIG. 9A and FIG. 9B are diagrams comparing second harmonics of spectra before and after calibration.
Figure 9B:
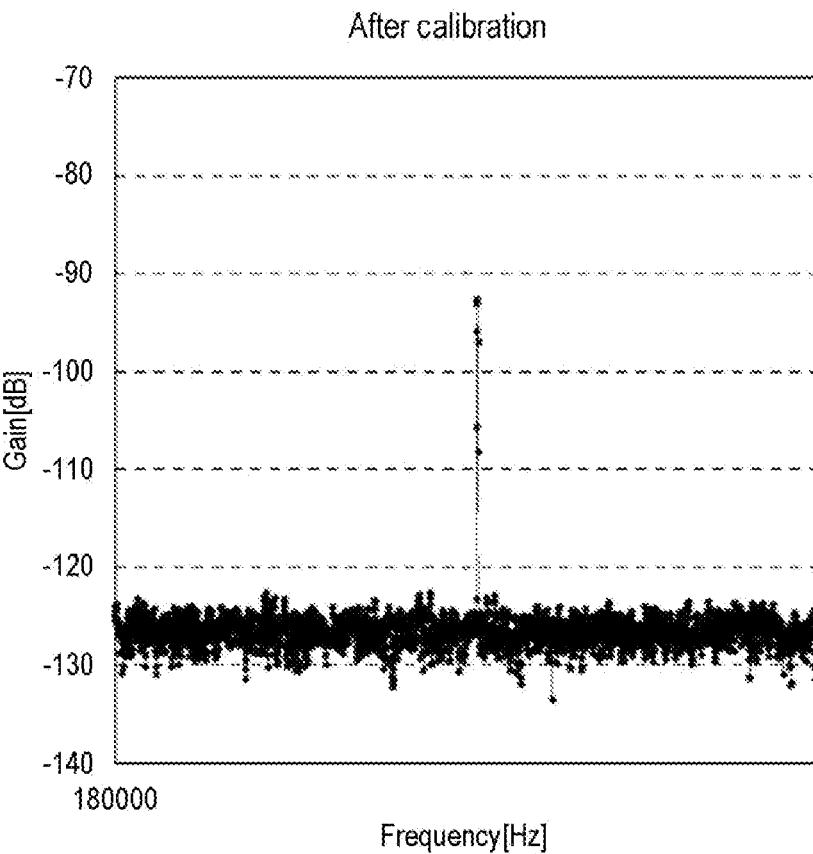

FIG. 9A and FIG. 9B are diagrams comparing second harmonics of spectra before and after calibration. After calibration, the strength of the second harmonic is smaller by 9.2 dB than before calibration.

Characteristics of the digital sine wave output signal DSINOUT after calibration are evaluated as follows:
SNR (Signal to Noise Ratio) 87.32 dB
SINAD (Signal-to-Noise And Distortion Ratio) 85.43 dB
THD (Total Harmonic Distortion) −89.92 dB
SFDR (Spurious Free Dynamic Range) −92.90 dB
The SINAD of 85.43 dB obtained here exceeds the dynamic range (84.28 dB) of a 14-bit A/D converter. In other words, it is possible to use the analog sine wave output signal ASINOUT generated by the sine wave generation circuit 100 configured using the 12-bit A/D converter 160 in evaluating the 14-bit A/D converter.

Subsequently, a modification of the sine wave generation circuit 100 is described.

Modification 1

In the embodiment, the second harmonic is canceled, but higher-order harmonics may also be canceled.

Figure 10:
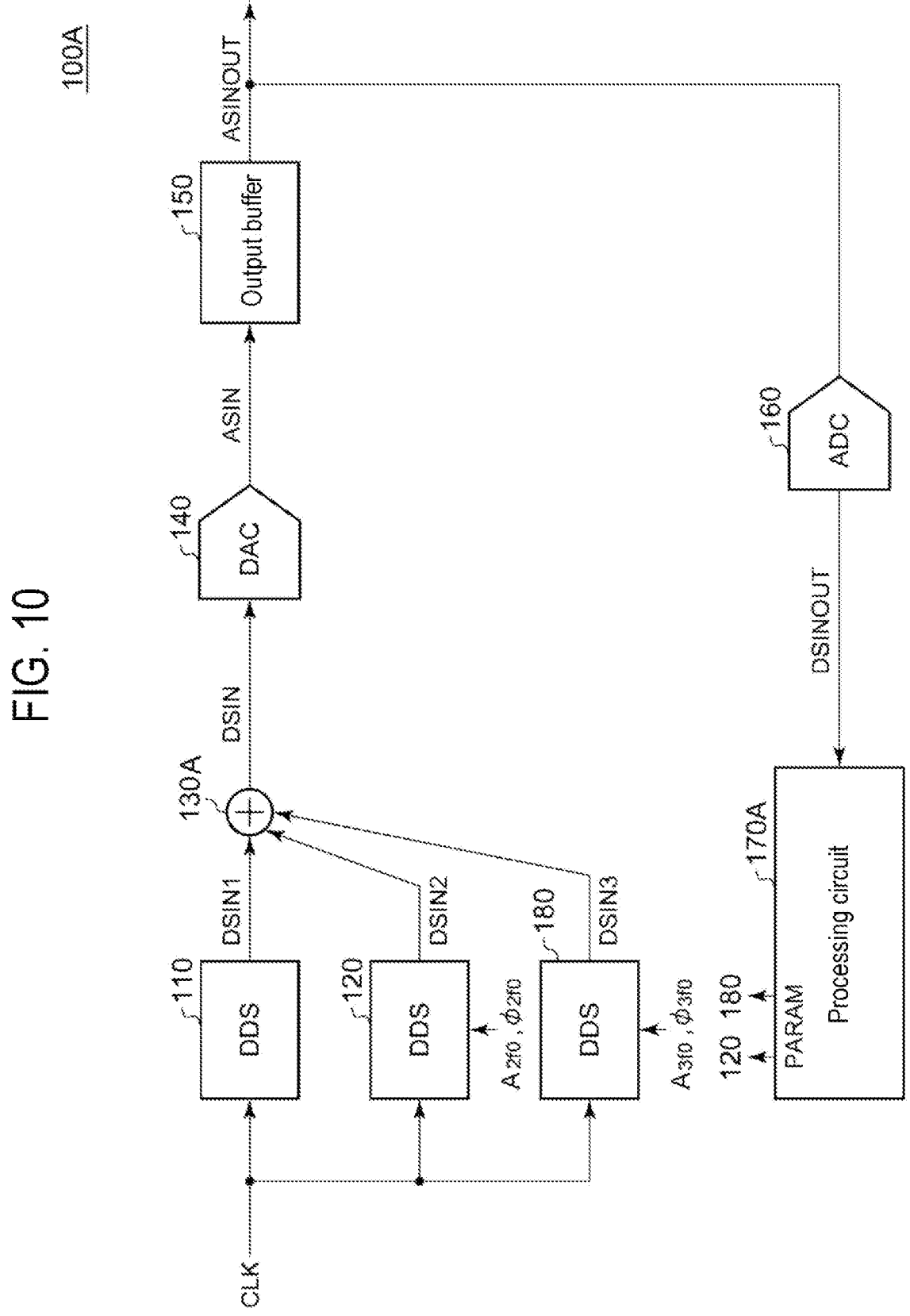
FIG. 10 is a block diagram of a sine wave generation circuit according to Modification 1.

FIG. 10 is a block diagram of a sine wave generation circuit 100A according to Modification 1. The sine wave generation circuit 100A includes a third direct digital synthesizer 180 in addition to the sine wave generation circuit 100 of FIG. 1. The third direct digital synthesizer 180 generates a digital third harmonic correction signal DSIN3 having a frequency of $3f_0$ in the normal operation mode. In the normal operation mode, a correction circuit 130A superimposes the digital second harmonic correction signal DSIN2 and the digital third harmonic correction signal DSIN3 on the digital sine wave fundamental signal DSIN1.

A processing circuit 170A performs FFT on the digital sine wave output signal DSINOUT output from the A/D converter 160 in the calibration mode to generate a complex spectrum. Then, a parameter PARAM of the third direct digital synthesizer 180 is set based on information on frequency $3f_0$ in the complex spectrum. The parameter PARAM for the third direct digital synthesizer 180 may include amplitude information $A_{3f0}$ and phase information $\varphi_{3f0}$. The third direct digital synthesizer 180 generates the digital third harmonic correction signal DSIN3 based on the amplitude information $A_{3f0}$ and the phase information $\varphi_{3f0}$ in the normal operation mode.

According to this modification, the second harmonic distortion may be canceled by the digital second harmonic correction signal DSIN2, and the third harmonic distortion may be canceled by the digital third harmonic correction signal DSIN3.

In the normal operation mode, a fourth direct digital synthesizer that generates a digital fourth harmonic correction signal DSIN4 having a frequency of $4f_0$ may be added to cancel a fourth distortion component.

Modification 2

In the embodiment, the second direct digital synthesizer 120 generates the digital second harmonic correction signal DSIN2 having the opposite phase to the distortion component of the second harmonic, and the correction circuit 130 adds the digital second harmonic correction signal DSIN2 generated, but the present disclosure is not limited thereto. For example, the second direct digital synthesizer 120 may generate a digital second harmonic correction signal DSIN2 that is in phase with the distortion component of the second harmonic, and the correction circuit 130 may subtract the digital second harmonic correction signal DSIN2 generated.

Applications

Figure 11:
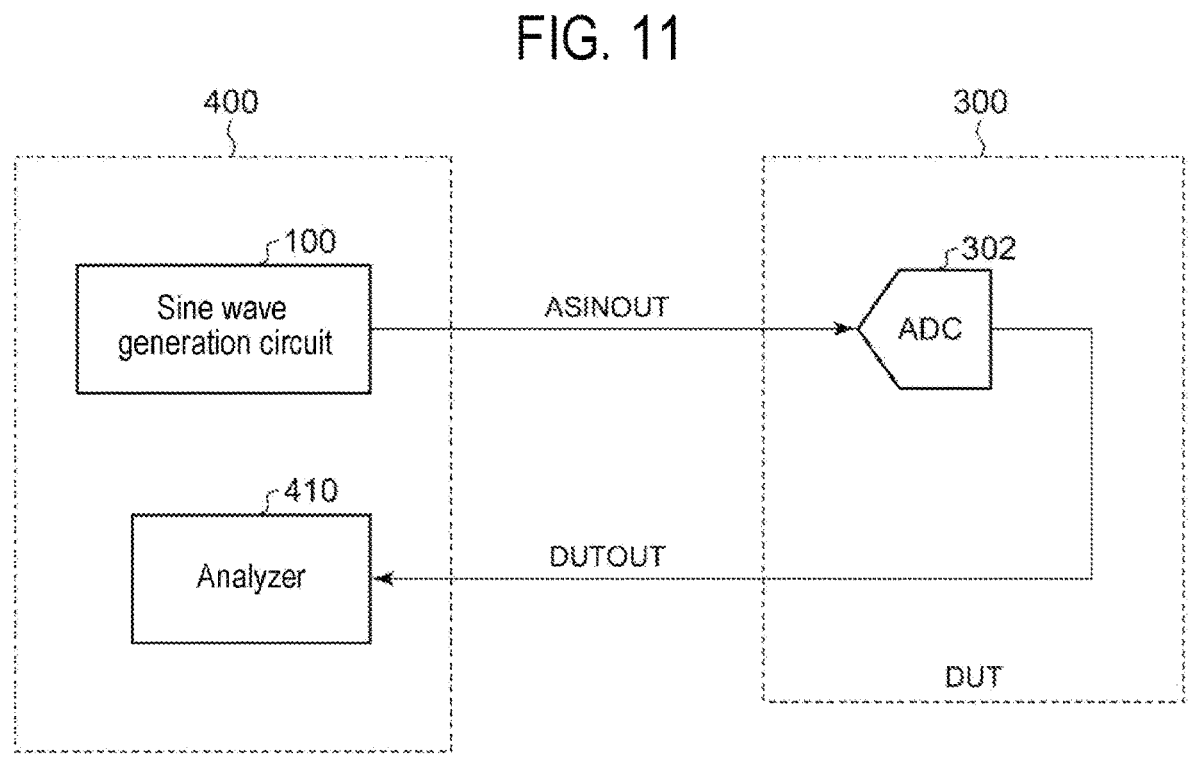

The application of the sine wave generation circuit 100 is described. The sine wave generation circuit 100 may be used in a test device for an A/D converter. FIG. 11 is a block diagram of a test device 400 according to an embodiment. A device under test (DUT) 300 includes an A/D converter 302. The test device 400 evaluates the A/D converter 302.

The test device 400 includes the above-described sine wave generation circuit 100 and an analyzer 410. The sine wave generation circuit 100 generates an analog sine wave output signal ASINOUT and supplies it to the A/D converter 302. The A/D converter 302 converts the analog sine wave output signal ASINOUT to a digital signal DUTOUT. The analyzer 410 analyzes the output signal DUTOUT of the A/D converter 302 and evaluates the performance of the A/D converter 302. An analysis method by the analyzer 410 is not particularly limited, but may employ, for example, the technique described in Japanese Patent Application Publication No. 2021-044690.

SUPPLEMENTARY NOTES

One aspect of the technique disclosed in the present disclosure may be understood as follows.

Supplementary Note 1

A sine wave generation circuit including:
a first direct digital synthesizer configured to generate a digital sine wave fundamental signal having a frequency $f_0$ in a normal operation mode and a calibration mode;
a second direct digital synthesizer configured to generate a digital second harmonic correction signal having a frequency $2f_0$ in the normal operation mode;
a correction circuit configured to superimpose the digital second harmonic correction signal on the digital sine wave fundamental signal;
a D/A converter configured to convert an output of the correction circuit into an analog sine wave signal;
an output buffer configured to receive the analog sine wave signal and output an analog sine wave output signal;
an A/D converter configured to convert the analog sine wave output signal into a digital signal in the calibration mode; and
a processing circuit configured to generate a spectrum by performing Fast Fourier Transform on the digital signal output by the A/D converter in the calibration mode and set a parameter of the second direct digital synthesizer based on information on the frequency $2f_0$ in the spectrum.

Supplementary Note 2

The sine wave generation circuit of Supplementary Note 1, wherein the processing circuit performs Fast Fourier Transform on waveform data whose starting point is a peak of a waveform of the digital signal generated by the A/D converter.

Supplementary Note 3

The sine wave generation circuit of Supplementary Note 1 or 2, further including: a third direct digital synthesizer configured to generate a digital third harmonic correction signal having a frequency $3f_0$ in the normal operation mode,
wherein the correction circuit superimposes the digital second harmonic correction signal and the digital third harmonic correction signal on the digital sine wave fundamental signal, and
wherein the processing circuit sets a parameter of the third direct digital synthesizer based on information on the frequency $3f_0$ in the spectrum.

Supplementary Note 4

The sine wave generation circuit of any one of Supplementary Notes 1 to 3, wherein the first direct digital synthesizer and the second direct digital synthesizer include a same configuration and operate based on a common clock signal.

Supplementary Note 5

The sine wave generation circuit of Supplementary Note 4, wherein the first direct digital synthesizer includes:
a first integrator configured to integrate a first input value according to the clock signal; and
a first waveform generator configured to include a sine wave table and output a value of a sine wave according to an output of the first integrator by referring to the sine wave table, and wherein the second direct digital synthesizer includes:
a second integrator configured to integrate a second input
value according to the clock signal; and
a second waveform generator configured to include a sine
wave table and output a value of a sine wave according
to an output of the second integrator.

Supplementary Note 6

A test device for A/D converter, including:
the sine wave generation circuit of any one of Supple-
mentary Notes 1 to 5, which generates the analog sine
wave output signal to be supplied to a device under test
that includes an A/D converter; and
an analyzer configured to analyze the digital signal output
by the A/D converter in response to the analog sine
wave output signal.

While certain embodiments have been described, these
embodiments have been presented by way of example only,
and are not intended to limit the scope of the disclosures.
Indeed, the embodiments described herein may be embodied
in a variety of other forms. Furthermore, various omissions,
substitutions and changes in the form of the embodiments
described herein may be made without departing from the
spirit of the disclosures. The accompanying claims and their
equivalents are intended to cover such forms or modifica-
tions as would fall within the scope and spirit of the
disclosures.

What is claimed is:
1. A sine wave generation circuit comprising:
a first direct digital synthesizer configured to generate a
digital sine wave fundamental signal having a fre-
quency $f_0$ in a normal operation mode and a calibration
mode;
a second direct digital synthesizer configured to generate
a digital second harmonic correction signal having a
frequency $2f_0$ in the normal operation mode;
a correction circuit configured to superimpose the digital
second harmonic correction signal on the digital sine
wave fundamental signal;
a Digital-to-Analog (D/A) converter configured to con-
vert an output of the correction circuit into an analog
sine wave signal;
an output buffer configured to receive the analog sine
wave signal and output an analog sine wave output
signal;

an Analog-to-Digital (A/D) converter configured to con-
vert the analog sine wave output signal into a digital
signal in the calibration mode; and
a processing circuit configured to generate a spectrum by
performing Fast Fourier Transform on the digital signal
output by the A/D converter in the calibration mode and
set a parameter of the second direct digital synthesizer
based on information on the frequency $2f_0$ in the
spectrum,
wherein the first direct digital synthesizer and the second
direct digital synthesizer include a same configuration
and operate based on a common clock signal,
wherein the first direct digital synthesizer includes:
a first integrator configured to integrate a first input
value according to the clock signal; and
a first waveform generator configured to include a sine
wave table and output a value of a sine wave
according to an output of the first integrator by
referring to the sine wave table, and
wherein the second direct digital synthesizer includes:
a second integrator configured to integrate a second
input value according to the clock signal; and
a second waveform generator configured to include a
sine wave table and output a value of a sine wave
according to an output of the second integrator.
2. The sine wave generation circuit of claim 1, wherein
the processing circuit performs Fast Fourier Transform on
waveform data whose starting point is a peak of a waveform
of the digital signal generated by the A/D converter.
3. The sine wave generation circuit of claim 1, further
comprising: a third direct digital synthesizer configured to
generate a digital third harmonic correction signal having a
frequency $3f_0$ in the normal operation mode,
wherein the correction circuit superimposes the digital
second harmonic correction signal and the digital third
harmonic correction signal on the digital sine wave
fundamental signal, and
wherein the processing circuit sets a parameter of the third
direct digital synthesizer based on information on the
frequency $3f_0$ in the spectrum.
4. A test device, comprising: the sine wave generation
circuit of claim 1, which generates the analog sine wave
output signal to be supplied to a device under test that
includes the A/D converter; and an analyzer configured to
analyze the digital signal output by the A/D converter in
response to the analog sine wave output signal.

* * * * *